(12) United States Patent
Docker et al.

(10) Patent No.: US 6,366,502 B1
(45) Date of Patent: Apr. 2, 2002

(54) CIRCUITRY FOR READING FROM AND WRITING TO MEMORY CELLS

(75) Inventors: Steven Charles Docker, Droitwich Spa (GB); Duane Galbi, Cambridge, MA (US)

(73) Assignee: STMicroelectronics Limited, Almondsbury Bristol (GB)

(*) Notice: Subject to any disclaimer, the term of this patent is extended or adjusted under 35 U.S.C. 154(b) by 0 days.

(21) Appl. No.: 09/588,168

(22) Filed: Jun. 5, 2000

(51) Int. Cl.[7] ................................. G11C 7/00
(52) U.S. Cl. ................... 365/189.04; 365/206
(58) Field of Search ............... 365/189.04, 206

(56) References Cited

U.S. PATENT DOCUMENTS 5,606,525 A * 2/1997 Fujii ............... 365/189.04

FOREIGN PATENT DOCUMENTS

JP          0136090      * 7/1985   ........... G11C/11/34

* cited by examiner

Primary Examiner—Trong Phan
Assistant Examiner—M. Tran
(74) Attorney, Agent, or Firm—Wolf, Greenfield & Sacks, P.C.; James H. Morris

(57) ABSTRACT

Circuitry for reading from and writing to memory cells of a group of memory cells. The circuitry comprises read circuitry and write circuitry each connectable to bit lines associated with respective ones of the memory cells. The read circuitry is arranged to read from the cells and the write circuitry is arranged to write to the cells. Wherein the read circuitry and write circuitry are configured so that more cells in the group can be simultaneously written to during a write operation than can be simultaneously read from during a read operation.

17 Claims, 3 Drawing Sheets

PRIOR ART

PRIOR ART

CIRCUITRY FOR READING FROM AND WRITING TO MEMORY CELLS

FIELD OF THE INVENTION

The present invention relates to circuitry for reading from and writing to memory cells.

BACKGROUND OF THE INVENTION

As general purpose and embedded microprocessors increase in clock frequency and performance, on-chip memories are provided to reduce the pin bandwidth (that is the number of pins) required by these microprocessors. By having the integrated circuit memory on chip, input and output pins to access an external memory are redundant or alternatively the number of accesses to an external location can be reduced, allowing pins to be used for a plurality of different functions. For high performance processors, these on-chip memories can consume a significant portion of the total chip area. This can have the disadvantage that the total chip area can be increased. This is undesirable.

On-chip memories typically handle four fundamental operations:

(1) load from a location (on chip). This involves single words being loaded in a clock cycle.

(2) store to a location (on chip). This involves single words being stored in a cycle.

(3) write a block of data into the on-chip memory for example from an external memory. This may involve a number of words, for example 4, 8 or 16.

(4) read a block of data from the on-chip memory often sending the data to an external memory. This may involve a number of words, for example 4, 8 or 16.

The first two operations take place on chip, wherein the second two operations involve off-chip locations.

Blocks of data are written into the on-chip memory from an external memory source. A microprocessor on the chip may utilise this data and perhaps other data to perform a calculation and the results of this calculation may be used to update the data stored in the on the chip memory. If a new block of data needs to be loaded into the on-chip memory the block being replaced might be one which had been changed since it has been loaded. Hence before the new data is loaded, the current block of data may need to be read and stored in another location. This location would typically be an external memory.

Generally memory cells which form an on-chip memory array are divided into groups of smaller numbers (for example 4) of memory cells with each group having read and write circuitry to allow data to be read from and written to the cells in the array. This grouping of cells is used because the sensing circuitry used to read data from cells is physically large relative to a single memory cell. Therefore the memory cells share sensing circuitry to avoid having to enlarge the memory array unnecessarily to accommodate sensing circuitry for each cell. In the past data has been written to and read from such memory groups at the same rate. That is to say only one cell in each group may be written to or read from in any one cycle.

However, it is sometimes required that a block of data be written to a relatively large number of memory cells in the on-chip memory. Since each cell in each group can only be written to at any one time a group having four cells will require four write cycles to write data into the group of cells. This type of operation is sometimes referred to as a block write operation. This relatively large number of clock cycles can delay the operation of the chip.

It is desirable that load store operations to and from on-chip memory occur more frequently than reading/writing operations where blocks of data are read from and written to the on-chip memory. Typically a system will be optimized such that the simple load/store operations require fewer cycles that is one cycle than do block read/write operations. Furthermore, since data stored in the on-chip memory often ends up being read only data, the write operation may occur more frequently than the read operation. Although block read/write operations may be less frequent than simple load/store operations, with large sparse (that is data which only use one or two words out of four or eight words) data sets, the time spent performing block operations can often be significant as discussed previously. Since the processor is halted while the block write operation is in progress, the time taken by this operation can have a significant impact in overall system performance. This is clearly disadvantageous.

One method of increasing the write data width of a RAM block would be to make a new RAM block by grouping together smaller numbers of cells. In other words, the number of cells in each group is reduced. Hence to double the write data width, the original RAM block is cut in half in such a manner that the original read/write data width ratios are retained. By grouping two of these blocks together one can generate a block which has twice the read and twice the write data width as the original blocks. However this approach would end up increasing the resulting effective RAM block size silicon area by approximately 10% and would require additional wiring resources to wire the smaller RAM blocks together to form the larger block. This is disadvantageous.

SUMMARY OF THE INVENTION

It is an object of embodiments of the present invention to address or at least mitigate these problems.

According to the present invention there is provided circuitry for reading from and writing to memory cells of a group of memory cells, said circuitry comprising read circuitry and write circuitry each connectable to respective bit lines associated with respective ones of said memory cells, wherein said read circuitry being arranged to read from said cells and said write circuitry being arranged to write to said cells, said read circuitry and write circuitry are configured so that more cells in said group can be simultaneously written to during a write operation than can be simultaneously read from during a read operation.

Embodiments of the present invention permit the time taken to write a block of data to be reduced without significantly increasing the area of an on-chip memory. Embodiments of the invention may use an efficient on-chip RAM architecture which may permit the required area for the memory to be relatively small.

DETAILED DESCRIPTION OF THE EMBODIMENTS OF THE INVENTION

Figure 1:
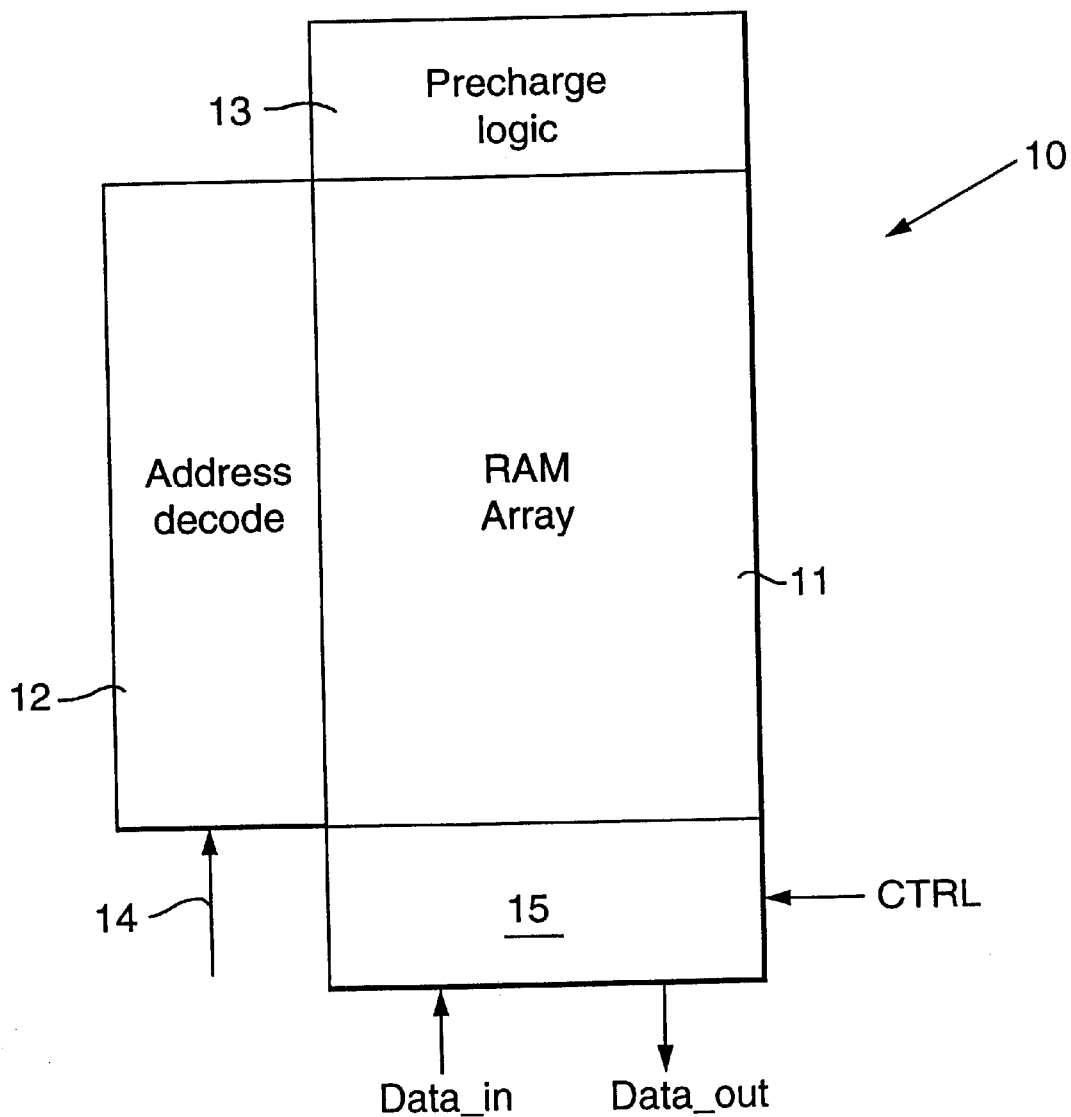
FIG. 1 is a schematic diagram of a conventional on-chip memory.

In the drawings like reference numerals refer to like parts.

FIG. 1 shows schematically the layout of a conventional on-chip memory 10 having an array 11 of memory cells together with an address decoder 12 and pre-charge logic 13 which are conventional. The address decoder 12 is responsive to an address signal on signal line 14 to select one or more memory cells in the memory array 11. The signal line 14 may of course comprise a plurality of lines.

Sense amplifier and write driver circuitry 15 is also provided. The sense amplifier part of the circuitry 15 is used to read the value stored in a cell whilst the write part of the circuitry writes a value to a given cell. The cell which is read or written to is defined by the address decoded by the address decoder 12. The circuitry 15 has an input DATA_IN which is the data or value to be written to a given cell and an output DATA_OUT which provides the data or value read out of a given memory cell in the memory array 11. The circuitry has an input for control signals CTRL which are input to the sense and write circuitry to control the writing of data on the DATA_IN input into the memory and the reading of data and its output by the output DATA_OUT.

Figure 2:
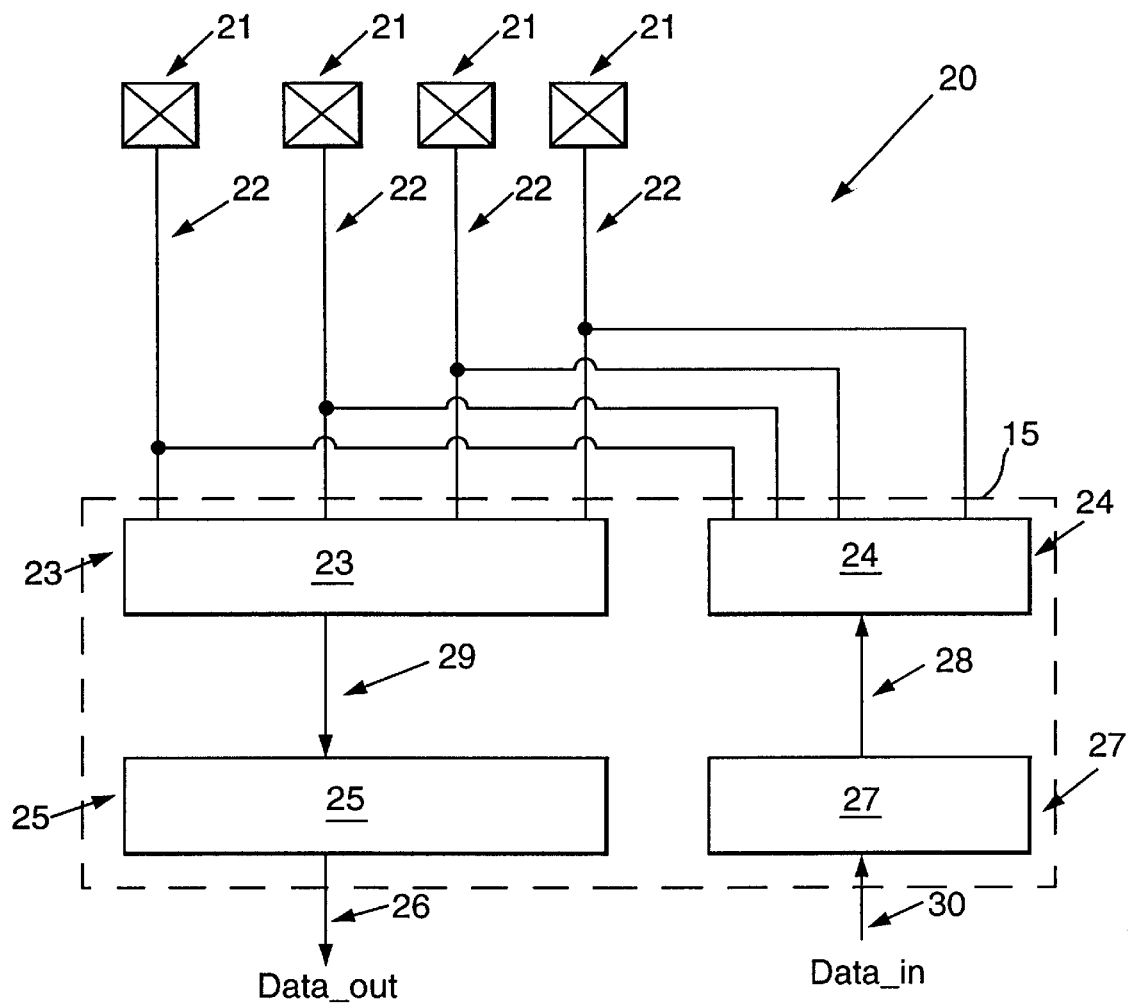
FIG. 2 is an exploded view of the sense amplifier and write driver circuitry of FIG. 1.

A portion 20 of the sense amplifier and write driver circuitry 15 used to write data into or read data from memory cells in the memory array 11 is shown in more detail in FIG. 2. Four memory cells 21 of the array 11 are shown. This portion 20 forms one of four major basic RAM building blocks. The other three building blocks are the RAM memory array 11 itself, the address decoder 12 and the precharge logic 13. Due to the fact that the data paths (which include amplifiers and buffers) must be able to sense the values on the bit lines quickly, they are physically large relative to the size of the memory cells themselves. A larger area is required for the write data circuitry for a cell than for the cell itself. Accordingly a group of, for example, four memory cells 21 share data path circuitry.

The four memory cells 21 shown in FIG. 2 are each connected to an associated bit line 22 as is characteristic of most high performance on-chip RAM blocks. These cells form a group and form part of the memory array 11. The bit lines 22 from the cells are each connected to read bit line selection circuitry 23 which selects which one of the four memory cells will be read by connecting the bit line 22 associated with that cell 21 to read data detection circuitry 25 via line 29. The detection circuitry 25 includes sense amplifiers or the like. Data is read out from the selected memory cell on line 26 via the DATA_OUT output.

The bit lines 22 of each cell 21 are also connected to write bit lines selection circuitry 24 which selects which one of the cells is to be written to when data is written by write driver 27 via line 28. The write bit lines selection circuitry 24 and the read bit lines selection circuitry 23 are effectively in parallel. The data to be written into the memory cells is provided to the write driver 27 on line 30 via the DATA_IN input. The read bit lines selection circuitry 23, the write bit lines selection circuitry 24, the read data detection circuitry 25 and the write driver 27 together define the sense amplifier and write driver circuitry 15.

It will be understood that there are many different circuit topologies described in the prior art for the above-mentioned elements. For high speed RAM blocks the above-mentioned elements are typically provided. This arrangement provides for data to be read out from or written to only one memory cell in a group at any one time. The read data width is the same as the write data width.

Figure 3:
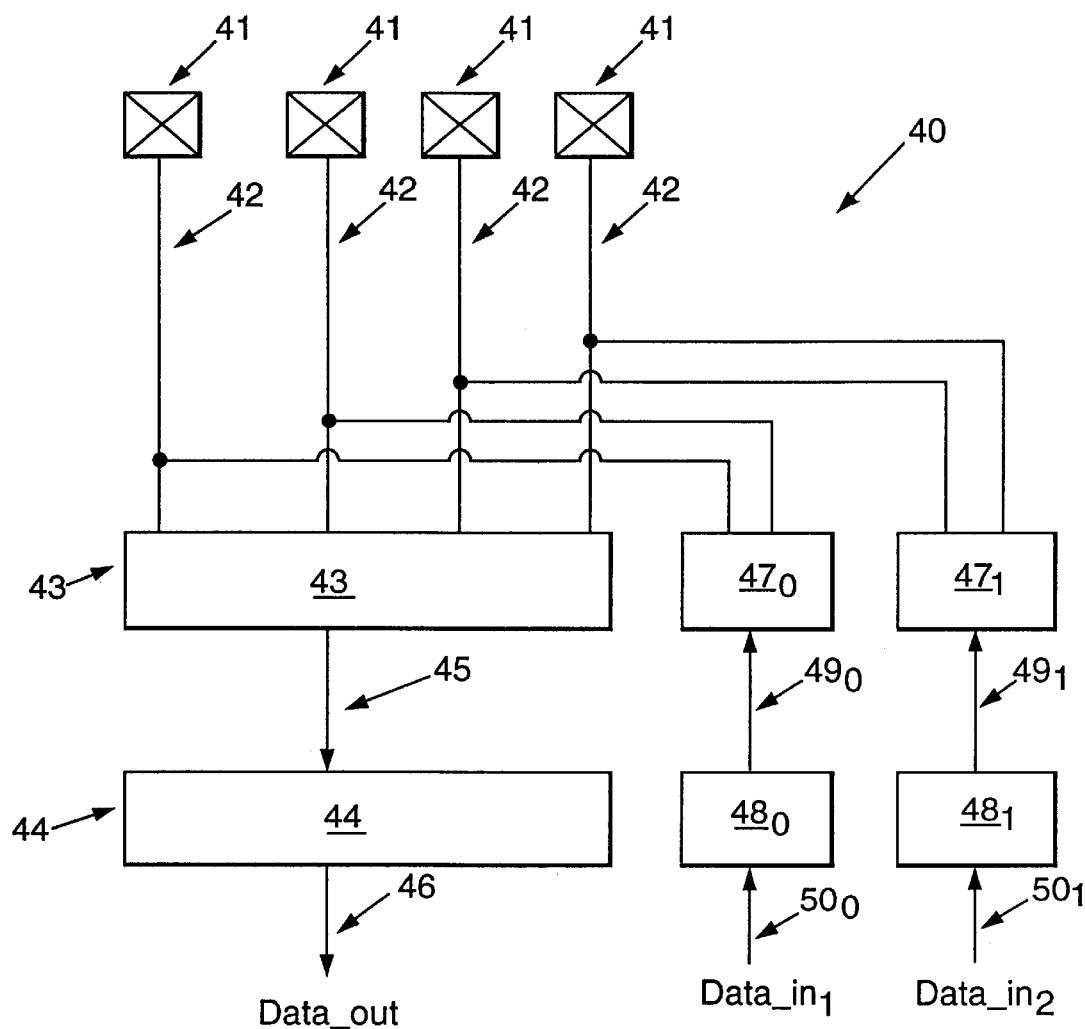
FIG. 3 is an exploded view of a sense amplifier and write driver circuitry embodying the present invention, which can be used in the arrangement of FIG. 1.

FIG. 3 shows schematically an exploded view of the sense amplifier and write driver circuitry embodying the invention, which can be used in conjunction with the arrangement of FIG. 1. As seen the write bit line selection logic is divided into two parts and there is a second write driver. The sense amplifier and write driver circuitry 40 of FIG. 3 replaces that shown in FIG. 2.

As shown in FIG. 3, four memory cells 41, which define a group are shown. Each cell 41 has a respective bit line 42 each of which is connected to read bit line selection circuitry 43. The read bit line selection circuitry operates conventionally as above described to select which one of the memory cells 41 is to be read by the read data detection circuitry 44 at a given time. The read bit line selection circuitry effectively acts as a multiplexer. Data is transferred along signal lines 45 from the selected memory cell 41 to the detection circuitry 44 and out from the sense amplifier and write drive circuitry 40 on line 46 via the output DATA_OUT.

The sense amplifier and write driver circuitry 40 is provided with two blocks of write bit line selection circuitry $47_0$ and $47_1$ each of which operates to select the bit line of the cell to which a value is to be written. However unlike the conventional circuitry of FIG. 2 each write bit line selection circuit $47_0$ and $47_1$ is only connected to two of the four bit lines 42 thus allowing the group size of memory cells to be halved. Each write bit line selection circuit $47_0$, 47, is connected to an associated write data driver $48_0$, $48_1$ along signal lines $49_0$ and $49_1$ respectively. In this way input data can be input via respective inputs DATA_IN1 and DATA_IN2 simultaneously on lines $50_0$ and $50_1$ and hence data may be written into two of the four memory cells at any one time. Each write bit line selection circuit effectively acts as a multiplexer.

Embodiments of the invention provide a RAM architecture which provides a low overhead method which provides a high density RAM building block with a write data width which is increased to be greater than its read data width. Embodiments of the invention enhances the N to 1 (typically N=4) multiplexing between the bit lines and the circuitry used to sense (read) values in the cell and/or update (write) the value in a cell. The RAM building block shown in FIG. 2 takes advantage of the small size of the circuit needed to force a bit line to a new state (ie perform a write operation) by modifying the N to 1 mapping present between the write data driver and the write bit line section logic and the bit lines. The N to 1 write mapping is broken into a set $$\{M_i \text{ to } 1 \ldots M_O \text{ to } 1\}$$

of mappings where the sum of $M_i \ldots {}_O$=N. N is the number of cells in a group and M represents the number of subgroups into which the group is divided. In the example shown, N=4 and M=2. One of the most useful of these is the set $$\{N/2 \text{ to } 1, N/2 \text{ to } 1\}$$

which results in a write bandwidth which is twice the read bandwidth.

In this way the basic RAM building block is enhanced by partitioning the write bitline selection logic 47 into two and by adding another write data driver 48. Making these changes increases the size of the basic RAM building block by less than 2%. The write time required for a block of data is reduced by 50%. This means that the CPU, in turn, is able to operate more efficiently.

Whilst embodiments of the present invention have been described in the context of a memory on an integrated circuit, embodiments of the present invention can be used with any other type of memory.

The memory can be any type of memory which is capable of being written to and read such as dynamic random access memories (DRAM), static random access memories (SRAM) and nonvolatile programmable memories such as PROMs, EEPROMs, EAROMs, EPROMs. The memory can be volatile or non-volatile.

In the embodiment described hereinbefore, a group of memory cells has four cells. However any other suitable number of cells may be provided in each group. In some embodiments of the invention, different groups may have different numbers of cells.

In the embodiment shown, the ratio of read to write circuitry for each group of cells is 1:2. However, in other embodiments of the invention, the ratio may be different, for example 1:3, 2:3 etc. In alternative embodiments of the invention, there may be more read than write circuitry, depending on the application of embodiments of the present invention.

It will be understood by those skilled in the art that modifications could be made to the present invention without departing from the scope of the present invention.

What is claimed is:

1. Circuitry for reading from and writing to memory cells of a group of memory cells, said circuitry comprising:
   read circuitry and write circuitry each connectable to bit lines associated with respective ones of said memory cells, said read circuitry being arranged to read from said cells and said write circuitry being arranged to write to said cells, wherein
   said read circuitry and write circuitry are configured so that a maximum number of cells in said group which can be simultaneously written to during a write operation is greater than a maximum number of cells in said group which can be simultaneously read from during a read operation.

2. Circuitry according to claim 1 wherein said read circuitry is arranged during a read operation, to permit data to be read from one memory cell in said group at a time; and
   said write apparatus is arranged during a write operation to permit data to be written simultaneously to at least two of said memory cells.

3. Circuitry according to claim 1 wherein said write circuitry comprises a plurality of multiplexing means each connectable to a subgroup of the group of cells and each multiplexing means is operable to enable data to be written to a selected memory cell associated with the respective subgroup.

4. Circuitry as claimed in claim 3, wherein the number of multiplexing means provided is equal to the number of cells of said group which can be simultaneously written to during a write operation.

5. Circuitry according to claim 3 wherein said write circuitry comprises a write driver associated with each one of said multiplexing means.

6. Circuitry according to claim 1 wherein said read circuitry comprises a read multiplexing means arranged to enable data to be read out from one of said plurality of memory cells.

7. Circuitry according to claim 1 wherein said read circuitry provides a read path respectively between said memory cells and an output and said write circuitry provides a write path between an input and said memory cells, wherein the width of said write path is greater than the width of said read path.

8. A circuitry as claimed in claim 1 wherein a plurality of groups of cells define a memory array.

9. Circuitry as claimed in claim 1, wherein said memory array is an on-chip memory array.

10. Circuitry according to claim 1, wherein the memory array is a RAM memory array.

11. Circuitry as claimed in claim 1, wherein said group of cells comprises four cells.

12. Circuitry as claimed in claim 11, wherein said read circuitry is arranged to read only one cell of said group at a time and the write circuitry is arranged to write to two cells of said group at the same time.

13. Circuitry as claimed in claim 1, wherein said group of cells has N cells and the write circuitry is arranged to write to 2 of said cells simultaneously.

14. Circuitry as claimed in claim 1 further comprising at least one group of memory cells.

15. An integrated circuit comprising circuitry for reading from and writing to memory cells of a group of memory cells, said circuitry comprising read circuitry and write circuitry each connectable to bit lines associated with respective ones of said memory cells, said read circuitry being arranged to read from said cells and said write circuitry being arranged to write to said cells, wherein said read circuitry and write circuitry are configured so that a maximum number of cells in said group which can be simultaneously written to during a write operation is greater than a maximum number of cells in said group which can be simultaneously read from during a read operation.

16. Circuitry for reading from and writing to memory cells of a group of memory cells, said circuitry comprising:
   read circuitry and write circuitry each connectable to bit lines associated with respective ones of said memory cells, said read circuitry being arranged to read from said cells and said write circuitry being arranged to write to said cells, wherein said read circuitry and write circuitry are configured so that a maximum number of cells in said group which can be simultaneously written to during a write operation is less than a maximum number of cells in said group which can be simultaneously read from during a read operation and wherein said read circuitry comprises a plurality of multiplexing means each connectable to a sub group of the group of cells and each multiplexing means is operable to enable data to be read from a selected memory cell associated with the respective sub group.

17. Circuitry for reading from and writing to memory cells of a group of memory cells, said circuitry comprising:
   read circuitry and write circuitry each connectable to bit lines associated with respective ones of said memory cells, said read circuitry being arranged to read from said cells and said write circuitry being arranged to write to said cells, wherein said read circuitry and write circuitry are configured so that a maximum number of cells in said group which can be simultaneously written to during a write operation is less than a maximum number of cells in said group which can be simultaneously read from during a read operation and wherein said read circuitry comprises a plurality of multiplexers each connectable to a sub group of the group of cells and each multiplexer is operable to enable data to be read from a selected memory cell associated with the respective sub group.

* * * * *